(12) United States Patent
Slavin et al.

(10) Patent No.: US 7,283,862 B1
(45) Date of Patent: Oct. 16, 2007

(54) RAPID MULTI-SLICE MR PERFUSION IMAGING WITH LARGE DYNAMIC RANGE

(75) Inventors: Glenn S. Slavin, Baltimore, MD (US); Thomas K. F. Foo, Potomac, MD (US)

(73) Assignee: General Electric Company, Schenectady, NY (US)

( * ) Notice: Subject to any disclaimer, the term of this patent is extended or adjusted under 35 U.S.C. 154(b) by 858 days.

(21) Appl. No.: 10/063,832

(22) Filed: May 16, 2002

(51) Int. Cl.
*A61B 5/05* (2006.01)

(52) U.S. Cl. .................. 600/420; 600/407; 600/410; 324/306; 324/307; 324/308; 324/309

(58) Field of Classification Search .......... 600/407, 600/410, 413, 419, 420, 521; 324/312, 306–310, 324/300
See application file for complete search history.

(56) References Cited

U.S. PATENT DOCUMENTS

| | | | | |
|---|---|---|---|---|
| 5,245,282 A | * | 9/1993 | Mugler et al. | 324/309 |
| 5,311,132 A | * | 5/1994 | Noll et al. | 324/309 |
| 5,320,099 A | * | 6/1994 | Roberts et al. | 600/413 |
| 5,406,203 A | * | 4/1995 | Oh et al. | 324/309 |
| 5,590,654 A | * | 1/1997 | Prince | 600/420 |
| 6,078,175 A | | 6/2000 | Foo | |
| 6,370,415 B1 | * | 4/2002 | Weiler et al. | 600/410 |
| 6,618,605 B1 | * | 9/2003 | Wolff et al. | 600/410 |
| 2002/0077538 A1 | * | 6/2002 | Saranathan et al. | 600/410 |
| 2003/0199750 A1 | * | 10/2003 | Park et al. | 600/410 |

OTHER PUBLICATIONS

Slavin, Glenn S., et al., Rapid Multi-Slice Renal Perfusion MR Imaging with Simultaneous Angiographic Screening, date unavailable.
Slavin, Glenn S., et al., First-Pass Myocardial Perfusion MR Imaging with Interleaved Notched Saturation; Feasibility Study, Radiology 2001, 219:258-263.

* cited by examiner

*Primary Examiner*—Brian L. Casler
*Assistant Examiner*—Baisakhi Roy
(74) *Attorney, Agent, or Firm*—Zialkowski Patent Solutions Group, SC

(57) ABSTRACT

The present invention includes a method and apparatus to perform rapid multi-slice MR imaging without ECG gating or requiring breath-holding that is capable of renal profusion analysis and angiographic screening. An ungated interleaved pulse sequence is applied in rapid succession, followed by a delay interval. The ungated interleaved pulse sequence is repeatedly played out with the predefined delay interval between each application of the pulse sequence. The resulting images provide not only a series of temporal phases of contrast-enhanced blood uptake for renal profusion analysis, but also provide enough dynamic range to include angiographic screening of the renal arteries.

31 Claims, 5 Drawing Sheets

RAPID MULTI-SLICE MR PERFUSION IMAGING WITH LARGE DYNAMIC RANGE

BACKGROUND OF INVENTION

The present invention relates generally to magnetic resonance imaging (MRI), and more particularly to a method and apparatus to rapidly acquire multi-slice MR perfusion images having a large dynamic range particularly useful in capturing both renal functionality and angiographic data simultaneously.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Visualization of blood flow into and out of the kidneys is indicative of renal function and perfusion. Having the capability to visualize the blood flow can be used to diagnose a broad range of diseases. In cases where compromised blood flow to the kidneys is suspected, perfusion imaging can be an important adjunct to magnetic resonance angiography (MRA) due to the uncertainties in the degree of stenosis as measured by MRA and its functional significance. Currently, most renal perfusion techniques are single slice acquisitions with relatively low temporal resolution. Such techniques require multiple breath-holds by the patient and therefore are time consuming and susceptible to blurring if the breath-holds are not held adequately. Further, although complete coverage of both kidneys is critical in ensuring visualization of local lesions, it is nearly impossible to do so with single slice techniques. That is, many single slice acquisitions may be reconstructed to form images of both kidneys, but such techniques are very time consuming and require multiple, exact-positioned patient breath-holds.

Contrast-enhanced MRI permits visualization of blood flow. However, rapid imaging is necessary to avoid motion artifacts. Further, the acquisition of multiple slices is required to visualize both kidneys, which often lie in different anatomical planes in their entirety. Therefore, a large dynamic range is necessary to see small changes in contrast uptake and to compensate for the relatively low signal-to-noise ratio caused by the preparatory saturation pulse and the rapid imaging acquisition.

Since MRI is the one modality that can provide morphologic, angiographic, and functional information in one session, it would be advantageous to acquire this information in a single scan. That is, since the degree of renal artery stenosis may not adequately reflect blood flow to certain organs, such as the kidneys, functional imaging is essential for renal evaluation.

It would therefore be desirable to have a method and apparatus that included a renal perfusion technique to allow rapid, high temporal resolution, multi-slice imaging of the kidneys that was not dependent upon ECG gating or periodic breath-holds. It would be additionally advantageous to have sufficiently large dynamic range to simultaneously include angiographic information of the renal arteries.

SUMMARY OF INVENTION

The present invention solves the aforementioned problems with the use of an interleaved acquisition in a non-ECG triggered scan resulting in multiple high-resolution images of the kidneys. The image data is acquired in rapid succession and can be performed with or without breath-holding. That is, the present technique allows renal perfusion analysis by rapidly acquiring high temporal resolution multi-slice images of the kidneys with sufficient spatial resolution to provide simultaneous angiographic information. The rapid acquisition of contiguous slices eliminates the need for breath-holding and minimizes slice misregistration. Furthermore, in accordance with the present invention, complete imaging coverage of the kidneys can be accomplished in approximately three seconds. Accordingly, the present invention provides an MR technique that allows evaluation of renal function by rapidly acquiring quantitative, high temporal resolution, multi-slice profusion images of the kidneys, while additionally providing sufficient spatial resolution to provide simultaneous angiographic information of the renal arteries.

A method of acquiring MR images is disclosed that includes applying an ungated pulse sequence and acquiring MR data in rapid succession of a selected anatomy. The method includes providing an intentional delay interval and then repeating the pulse sequence to acquire the ungated, multi-slice images with large dynamic range.

A pulse sequence is disclosed for profusion imaging that includes an interleaved preparation/acquisition sequence. This interleaved sequence has a number of preparation pulses and acquisition slices wherein each preparation pulse corresponds to a given acquisition slice and is timed to occur such that at least one other preparation pulse and one other acquisition slice occur between the corresponding pulse and slice. The interleaved sequence is then followed by a dead space to provide delay time sufficient to allow patient free-breathing. The repetition time is defined as the time of the interleaved preparation/acquisition sequence followed by the dead space. Each scanning session is defined by a prescribed number of times the pulse sequence of the repetition time is played out.

In accordance with another aspect of the invention, an MRI apparatus is disclosed to acquire multiple MR images having high resolution and increased spatial resolution that includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to apply a pulse sequence that interleaves a given preparation pulse and acquisition slice combination with a preparation pulse and acquisition slice for another preparation pulse and acquisition slice combination. The pulse sequence is played out in rapid succession and is followed by a user prescribed delay time before it is repeated a prescribed number of times. A series of multiple high-resolution images is then reconstructed to provide the high temporal resolution and increase spatial resolution images sufficient to evaluate renal function and profusion.

In accordance with another aspect of the invention, the invention is embodied in a computer program stored on a computer readable storage medium and having instructions which, when executed by a computer, cause the computer to receive a user prescription defining selection of an interleaved pulse sequence, and in response thereto, receive at least a user prescribed delay time defining a period of time between application of the interleaved pulse sequence, an imaging plane, and a desired number of slices to be acquired with each pulse sequence application. The computer is also caused to apply the interleaved pulse sequence such that each preparation pulse is immediately followed by an acquisition slice with no delay time therebetween. A series of high resolution images is then acquired in rapid succession.

In accordance with another aspect of the invention, a method of analyzing renal function with functional MRA imaging includes injecting a contrast agent in a patient, defining an area of interest to include both kidneys of the patient, and applying an interleaved acquisition pulse sequence to the area of interest. The method also includes acquiring a series of high resolution images of the area of interest in rapid succession and then allowing a delayed relaxation time. The application of the interleaved acquisition pulse sequence is repeated along with the step of acquiring a series of high resolution images followed by a delayed relaxation time, a prescribed number of times. The method lastly includes evaluating the series of images that depict temporal phases of the contrast-enhanced blood uptake of both kidneys.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
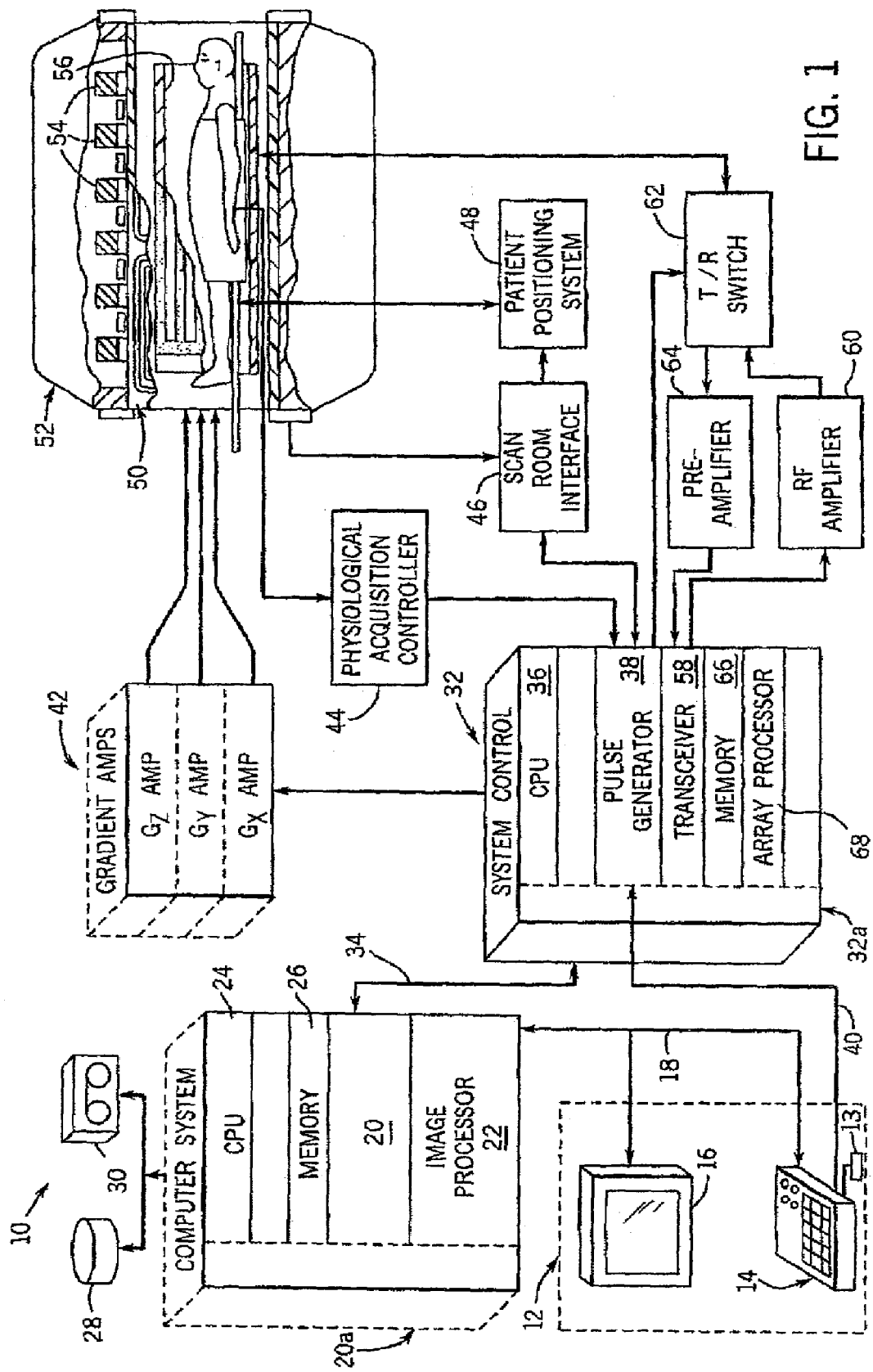
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a method and system suitable for use with the above-referenced NMR system, or any similar equivalent system for obtaining MR images. The invention is directed toward obtaining contrast-enhanced MR renal perfusion imaging using an ungated, multi-slice, rapid acquisition with a large enough dynamic range to include multiple anatomic organs and a clinical application/ process thereof. In a preferred embodiment, this technique offers a new application for renal perfusion with MR imaging. Because the invention includes repeated magnetization-preparation-acquisition of numerous sections of the kidneys in a very short time, the acquisition portions of the scan can be performed regardless of any required breath-holding. That is, while this technique can be performed with breath-holding, it is not necessary and therefore has a broader range of application. This technique provides image contrast and flexibility of prescription not previously available.

Figure 2:
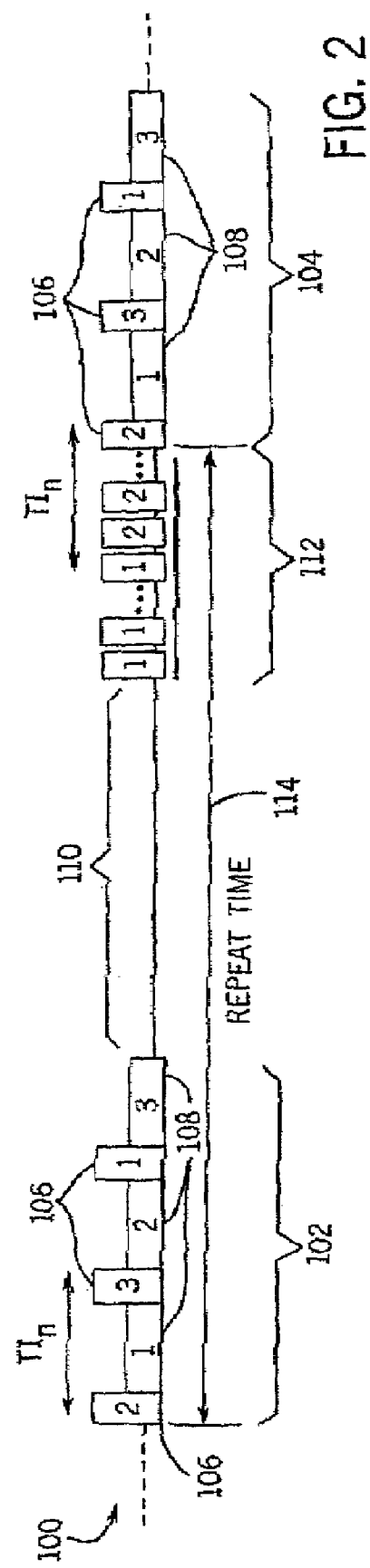
FIG. 2 is a timing diagram of a pulse sequence according to the present invention.

The present invention employs a technique in which an interleaved acquisition pulse sequence is played out to acquire images during a scanning session without the need of an ECG trigger. Referring to FIG. 2, a pulse sequence 100 is shown in accordance with the present invention. As indicated, the sequence is not gated to an ECG signal and the respective preparation pulses and acquisition slices are interleaved. The pulse sequence 100 includes an interleaved preparation/acquisition sequence 102, 104 that is played out a predefined number of intervals. The interleaved preparation/acquisition sequence 102, 104, has a number of preparation pulses 106 and a number of acquisition slices 108, where each preparation pulse 106 is paired to a corresponding given acquisition slice 108 as indicated with the matching numerals 1-1, 2-2, 3-3, etc. That is, preparation pulse #2 prepares the tissue for acquisition slice #2 which is timed to occur such that at least one other preparation pulse, for example #1, and one other acquisition slice, for example #3, occur between the preparation pulse #2 and the acquisition slice #2. In other words, pulse sequence 100 includes the interleaving of a given preparation pulse and acquisition slice combination with a preparation pulse and acquisition slice for different preparation pulse and acquisition slice combinations.

The interleaved preparation/acquisition sequence 102, 104 is played out in rapid succession a given number of times to acquire multiple slices in different planes of the anatomy of interest. A delay time 110 is provided between each interleaved preparation/acquisition sequence 102, 104, etc. and includes dead space that can be used to allow patient free breathing before the occurrence of a next interleaved preparation/acquisition sequence. Preferably, the dead space 110 has a predefined delay time set by the operator that can be timed according to each patient's breathing cycle. In this manner, a series of high resolution images can be acquired in rapid succession of the area of interest. A steady state preparation sequence 112 is preferably played out before the next interleaved preparation/acquisition sequence 104. The steady state preparation sequence is used to ensure the appropriate state of magnetization for the next preparation/ acquisition sequence. $TI_n$ represents the recovery time between the preparation and acquisition of slice n. The repeat time 114 is the time for one complete cycle and is repeated a prescribed number of times, as desired by the physician or clinician.

FIG. 2 shows an exemplary pulse sequence 100 having three slices. However, it is understood that the pulse sequence may have any number of slices that are deemed appropriate by the operator representing as many slice acquisitions as can reasonably be accomplished in a short period of time for adequate analysis. The magnetization-preparation acquisition can be repeated an arbitrary number of times with an arbitrary time interval therebetween. These parameters are selectable by the user based on the particular patient and the types of images desired.

The present invention can employ either a conventional slice-selective RF pulse or a specially-selective RF pulse for the preparation sequence. An example of such a specially-selective RF pulse is shown with reference to FIG. 3 which shows a notched RF saturation pulse 120. The profiles of the saturation pulses 106 of FIG. 2 are shown spatially with respect to a plurality of slice locations 122. Each of the saturation pulses 106 includes a stop band 124 between a pair of pass bands 126 so that the spins of the next slice location to be scanned are located within the stop-band of the pulse and are unaffected by the RF saturation pulse. However, spins within the pass-bands 124 are effectively saturated, which is the converse of a conventional RF excitation pulse. The magnetization of the spins within the immediate slice are not perturbed and only the spins that are outside the slice location experience this saturation pulse. Image acquisition of the next slice will not commence until after the next notched RF pulse is transmitted. The spins in the next slice will have recovered for a time TI, equivalent to the time of an image acquisition segment.

The present invention contemplates interleaving of the pre-saturation RF pulses, while providing saturation of blood over a large volume outside of a slice thickness defined by the size of the stop-band 124. Since each given slice is prepared before the acquisition of the preceding slice, the first slice in the sequence represents a special case. The first slice of the first phase has no preparation. In the example FIG. 3, although it is understood that FIG. 3 demonstrates a portion of the sequence in the middle of the sequence, if slice n-1 were the first sequence in the first phase of the imaging, it would have no corresponding preparation pulse. Subsequent phases of the first slice, however, are prepared by the saturation pulse that preceded the last slice of the previous phase. That is, slice 1 of phase 2 is saturated by the preparation pulse preceding the last slice of phase 1.

Figure 3:
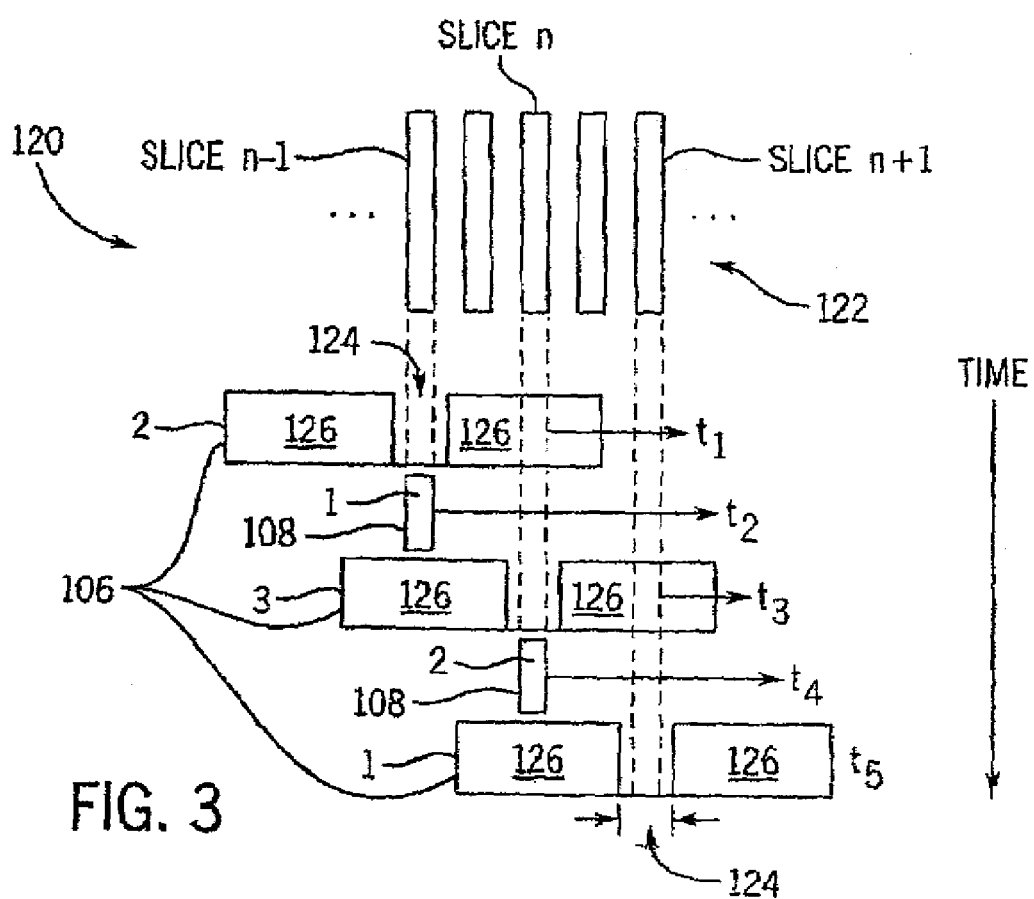
FIG. 3 is a timing diagram of a pulse sequence in accordance with another aspect of the present invention.

In the preparation scheme shown in FIG. 3, slice n is saturated by the preparation pulse #2 at time $t_1$ that precedes the acquisition 108 (#1) at time $t_2$ of slice n-1. Slice n is subsequently unaffected by the preparation pulse #3 at time $t_3$ that immediately precedes its acquisition 108 (#2) at $t_4$. Therefore, the time between the preparation of each slice and the acquisition of that slice is the effective TI. In this case, TI is $t_4-t_1$. In a preferred embodiment, the slices are acquired in an interleaved manner, rather than sequentially, to allow a wider notch, or stop-band 124, to compensate for potential cardiac motion between saturation and readout. The slices are so labeled to reflect the actual temporal order of the interleaved slices.

In one preferred embodiment, the width of notch 124 is a user selectable parameter, which may be input through input device 13, FIG. 1. Ideally, the width of notch 124 should be greater than the image slice thickness sought. The pass-bands 126, on either side of the notch 124, are fixed at approximately five times the width of notch 124 in this embodiment. It is understood, however, that FIG. 3 demonstrates a special case and the present invention is not limited to the application of a notched RF pulse as shown in FIG. 3.

Accordingly, the present invention includes a clinical process of analyzing renal function with functional MR imaging that includes injecting a contrast agent in a patient, defining an area of interest to include a plane having both kidneys therein, applying an interleaved acquisition pulse sequence to the area of interest, and acquiring a series of high resolution images of the area of interest in rapid succession. This technique also includes providing a delayed relaxation time and then repeating the aforementioned steps a prescribed number of times. The method accordingly includes evaluating the series of images depicting temporal phases of contrast-enhanced blood uptake of both kidneys.

Contrast-enhanced perfusion imaging can be performed using ungated multi-shot echo-planar imaging during free breathing. Magnetization preparation is achieved using interleaved saturation recovery, as previously described. In a preferred embodiment, there is no dead space between slices, as the magnetization recovery time TI for a given slice is simultaneous with the acquisition of the previous slice. The maximum temporal resolution, defined as the time between consecutive acquisitions at the same slice location, equals $N_S \times TI$, where $N_S$ is the number of imaged slices acquired. Lower temporal resolution can also be achieved, allowing even shorter repeated breath-holds.

Actual perfusion MR imaging was conducted using a 1.5 T Signa CV/i scanner from GE Medical Systems, Milwaukee, Wis. Parameters included forty mT/m peak gradients and 150 T/m/s maximum slue rate. Other imaging parameters were: echotrain length (ETL 4); TI 272 msec; TR 8.8 Msec; TE 1.4 msec; 224×160 matrix; 25° flip angle; 40×30 cm field-of-view; contiguous 7 mm slices; 250 kHz bandwidth; 0.025 mmol/kg gadodiamide. Temporal resolution, which depended on the number of acquired slices, was 2-3 sec for coverage of both kidneys. Total scan time, which depended on the number of desired phases, was typically 2 to 4 minutes.

Quantitative image analysis can be performed that include operations for independent motion registration of both kidneys, surface coil intensity correction, and generation of enhancement curves.

Figure 4:
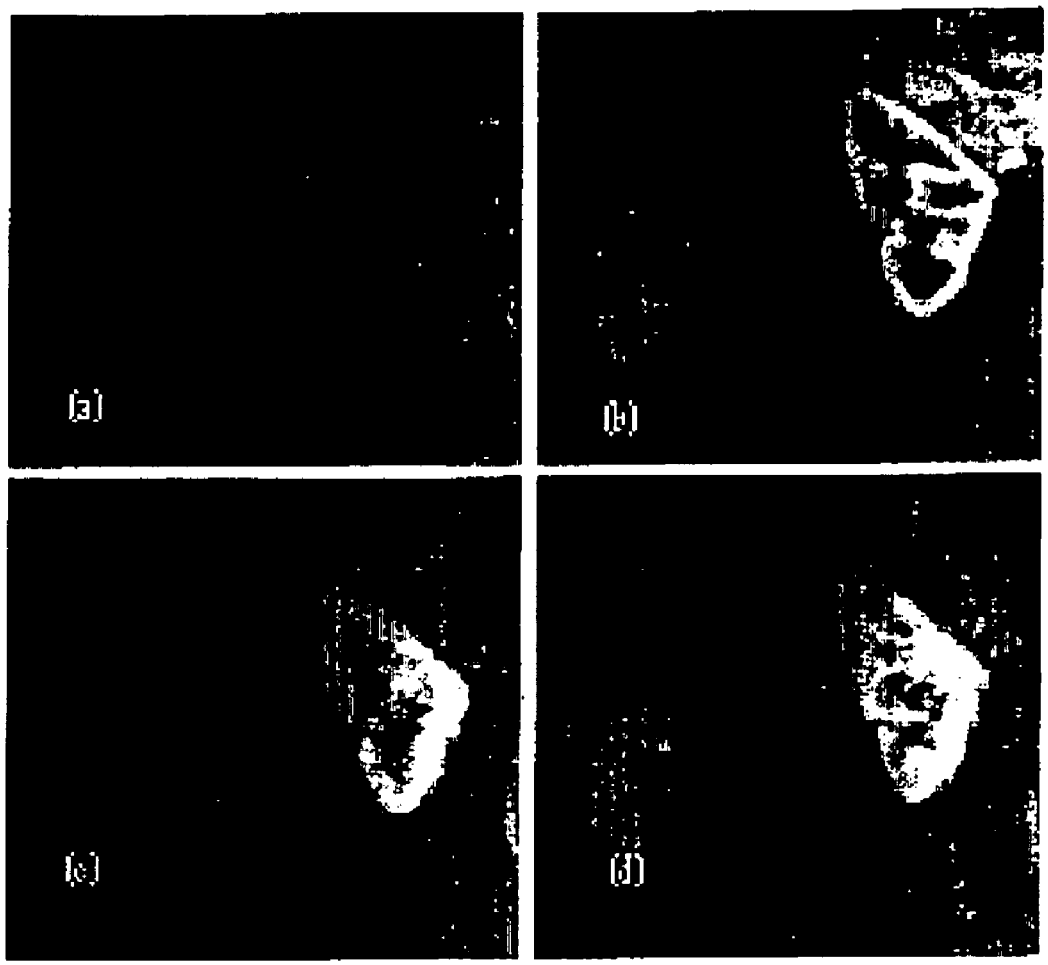
FIG. 4 is a set of images of the same slice location showing temporal changes.

FIG. 4 shows four temporal phases of one slice location from a volunteer patient. Images are shown prior to contrast injection (a), and at 20 seconds after injection (b), 75 seconds after injection (c), and at 215 seconds after injection (d). These four perfusion images from one slice location demonstrate pre-contrast (a), cortical (b), mudullary (c), and excretory (d) phases of contrast passage. In this example, eight slices were acquired with a temporal resolution of 2.2 seconds.

Figure 5:
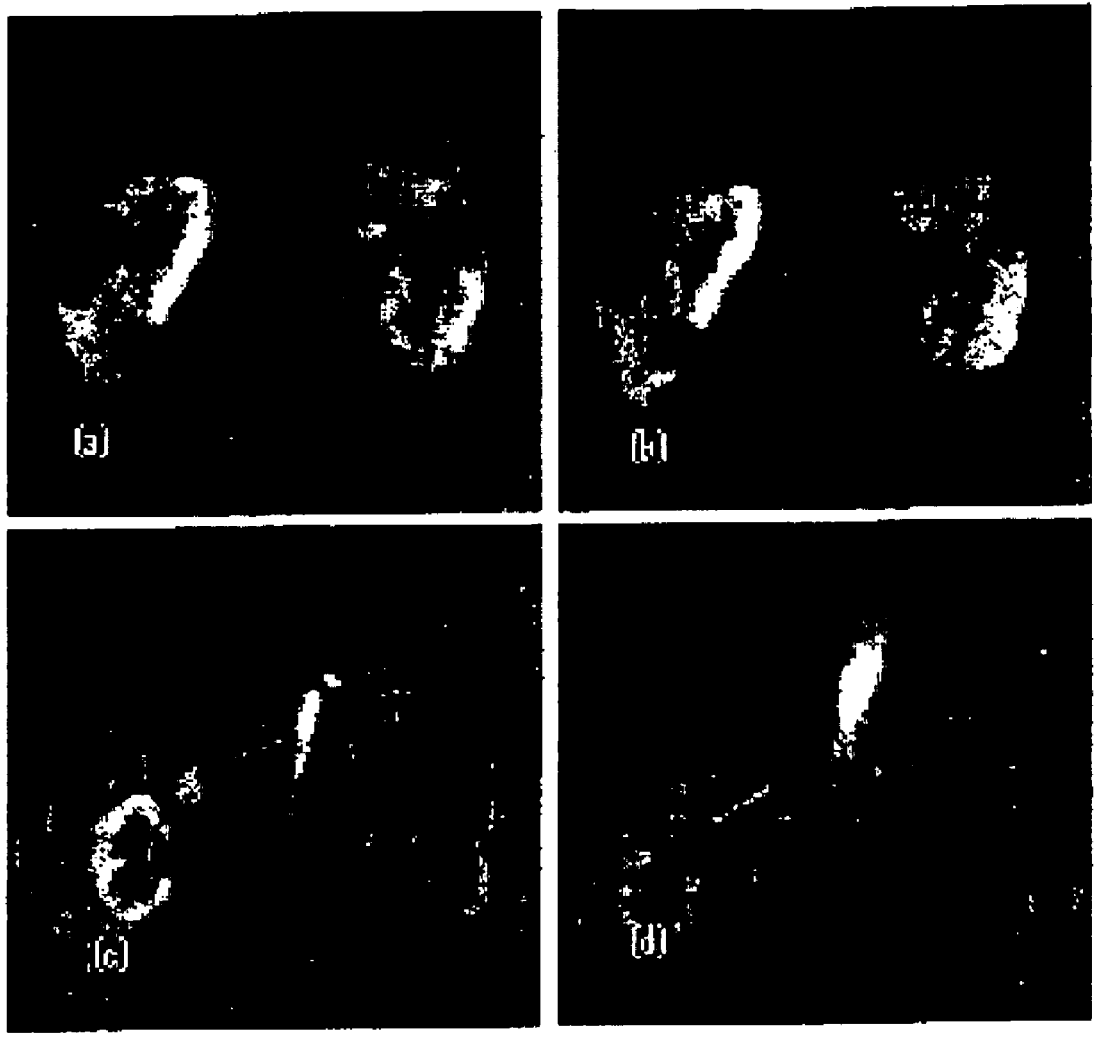
FIG. 5 is a set of images of four different slice locations with the same phase.

FIG. 5 shows image of four different slice locations but during the same phase from a patient with renal cysts. The lack of enhancement in the cysts corroborates the non-cancerous nature of the lesions. The cyst shown in the left kidney of FIG. 5(a) is not readily apparent in the adjacent slice shown in FIG. 5(b), underscoring the importance of a multi-slice acquisition. FIG. 5 shows four slices from a nine slice acquisition, with a 20 second post injection clearly showing the renal cyst in (a) and (b). FIG. 5 also shows two perfusion images (c), (d), from contiguous slices. These MR angiographic images show proximal (c) and distal (d) portions of the renal arteries using maximum intensity projections.

As will now be apparent, the present invention demonstrates a free breathing, multi-slice renal perfusion technique that offers complete coverage of both kidneys with high temporal resolution and improved contrast enhancement using a very low contrast dose. With this technique, a single scan can provide a comprehensive evaluation of renal function.

Accordingly, the present invention includes a method of acquiring MR images that includes applying an ungated pulse sequence and acquiring MR data in rapid succession of a selected anatomy, providing a delay interval, and then repeating the application of the pulse sequence and delay interval a prescribed number of times. The method has enough dynamic range to thereby acquire MR image data of a second selected anatomy simultaneously with the first selected anatomy. In the aforementioned example, the first selected anatomy are kidneys of the patient and the invention further includes further reconstructing MR data images acquired in a series that depict temporal phases of contrast-enhanced blood uptake for renal function and perfusion evaluation. The second selected anatomy can therefore be a cardiac region of the patient to acquire angiographic information as well. Preferably, an interleaved saturation recovery sequence for magnetization preparation is applied before each pulse sequence is played out.

The invention also includes a pulse sequence for perfusion imaging of an anatomy of interest that includes an interleaved preparation acquisition sequence having a number of preparation pulses and a number of acquisition slices. Each preparation pulse corresponds to a given acquisition slice and is timed to occur such that at least one other preparation pulse and one other acquisition slice occur therebetween. A dead space is provided to allow a delay time sufficient to allow patient free breathing and magnetization equalization. A repetition time defines a time of the interleaved preparation/acquisition sequence followed by the dead space. A scanning session defines a prescribed number of times the pulse sequence and the repetition time is repeated. Additionally, a steady state preparation sequence can occur after each interleaved preparation acquisition sequence and preferably, immediately before a next interleave preparation/acquisition sequence. The pulse sequence is played out without any ECG trigger and acquires a series of multiple high resolution images in rapid succession. The dead space is preferably a user prescribed delay interval to allow magnetization equilibrium and free-breathing.

The invention also includes an MRI apparatus to acquire MR images having high temporal resolution and increased spatial resolution that includes a magnetic resonance imaging system having a plurality of gradient coils positioned about a bore of a magnet to impress a polarizing magnetic field and an RF transceiver system and an RF switch controlled by a pulse module to transmit RF signals to an RF coil assembly to acquire MR images. The MRI apparatus also includes a computer program to apply a pulse sequence that interleaves a given preparation pulse and acquisition slice combination with a preparation pulse and acquisition slice for different preparation pulse and acquisition slice combinations. The preparation pulses and acquisition slices are played out in rapid succession a given number of times, followed by a user prescribed delay time before repeating the entire pulse sequence a prescribed number of times. A series of multiple high resolution images can therefore be reconstructed.

The invention additionally includes a computer readable storage medium having stored thereon a computer program comprising instructions which, when executed by a computer, causes the computer receive a user prescription that defines selection of an interleaved pulse sequence. In response thereto, the computer receives at least a user prescribed delay time defining a time period between application of the interleaved pulse sequence, an imaging plane, and a desired number of slices to be acquired with each pulse sequence application. The interleaved pulse sequence is applied such that each preparation pulse is immediately followed by an acquisition slice with no delay time therebetween. A series of high resolution images is then acquired in rapid succession.

A method of analyzing renal function with functional MR imaging is incorporated herein that includes injecting a contrast agent in the patient, defining an area of interest to include both kidneys of the patient, and applying an interleaved acquisition pulse sequence to the area of interest. The method also includes acquiring a series of high resolution images of the area of interest in rapid succession, allowing a delayed relaxation time, and repeating the aforementioned steps a prescribed number of times. This method concludes with evaluating the series of images depicting temporal phases of contrast-enhanced blood uptake of both kidneys.

The present invention has been described in terms of the preferred embodiment, and it is recognized that equivalents, alternatives, and modifications, aside from those expressly stated, are possible and within the scope of the appending claims.

What is claimed is:

1. A method of acquiring MR images comprising:
   (A) applying an ungated pulse sequence and acquiring multi-slice MR data in rapid succession of a first selected anatomy;
   (B) providing a delay interval of sufficient length to allow for subject free-breathing, wherein the delay interval is user-prescribed and is in the range of 10-20 seconds to allow for the subject free-breathing;
   (C) repeating steps (A) and (B) a prescribed number of times;
   (D) transmitting a notched RF saturation pulse having a stop-band between a pair of pass-bands; and
   (E) acquiring MR data for the slice location in the stop-band of the notched RF saturation pulse.

2. The method of claim 1 further comprising acquiring MR data of a second selected anatomy simultaneously with the first selected anatomy.

3. The method of claim 2 wherein the second selected anatomy is a cardiac region of the patient to acquire angiographic information about the patient.

4. The method of claim 1 further comprising the step of injecting a contrast agent in a patient for perfusion analysis imaging.

5. The method of claim 4 wherein the first selected anatomy are kidneys of the patient and further comprising reconstructing the MR data acquired into a series of images depicting temporal phases of contrast-enhanced blood uptake for renal function and perfusion evaluation.

6. The method of claim 1 further comprising reconstructing ungated multi-shot echo-planar images and acquiring the MR data during free-breathing.

7. The method of claim 1 further comprising applying an interleaved saturation recovery sequence for magnetization preparation before each pulse sequence is played out.

8. The method of claim 1 wherein the notched RF saturation pulse is designed to saturate all slice locations in a volume of slice locations selected except a slice location in which MR data is to be acquired after the transmission of the notched RF saturation pulse.

9. The method of claim 1 wherein a width of the stop-band of the notched RF saturation pulse is greater than that of a slice location thickness.

10. The method of claim 9 wherein a width of the notched RF saturation pulse is a user-selectable parameter.

11. A computerized system configured to play out a pulse sequence for perfusion imaging of an anatomy of interest, the computerized system comprising a computer programmed to apply:
    an interleaved preparation/acquisition sequence having a number of preparation pulses and a number of acquisition slices, wherein each preparation pulse corresponds to a given acquisition slice and is timed to occur such that at least one other preparation pulse and one other acquisition slice occur therebetween;
    a dead space to provide a delay time sufficient to allow patient free-breathing;
    a repetition time defining a time of the interleaved preparation/acquisition sequence followed by the dead space; and
    a scanning session defining a prescribed number of times the pulse sequence with the repetition time is repeated; and
    wherein the computerized system plays out the pulse sequence to acquire at least 12 contiguous slices within approximately three seconds to accomplish a thorough renal perfusion examination in under 5 minutes.

12. The computerized system of claim 11 wherein the pulse sequence is further defined by a steady state preparation sequence occurring after each interleaved preparation/acquisition sequence and before a next interleaved preparation/acquisition sequence.

13. The computerized system of claim 11 wherein the pulse sequence is further defined to be played out without an ECG trigger and acquires a series of multiple high-resolution images in rapid succession.

14. The computerized system of claim 13 wherein the anatomy of interest includes at least both kidneys of a patient in a single slice plane and the series of images acquired depict a series of temporal phases of contrast-enhanced blood uptake.

15. The computerized system of claim 14 wherein the anatomy of interest also includes angiographic images for combined renal evaluation and MR angiography analysis.

16. The computerized system of claim 11 wherein the dead space is a user prescribed delay interval to allow magnetization equilibrium.

17. The computerized system of claim 11 wherein the pulse sequence is further defined by a notched RF excitation pulse having a stop-band between a pair of pass-bands.

18. The computerized system of claim 17 wherein a width of the stop-band of the notched RF saturation pulse is greater than that of a slice location thickness.

19. An MRI apparatus to acquire multiple MR images having high temporal resolution and increased spatial resolution comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer programmed to:
    apply a pulse sequence that interleaves a given preparation pulse and acquisition slice combination with a preparation pulse and acquisition slice for different preparation pulse and acquisition slice combinations, in rapid successions a given number of times, followed by a user-prescribed delay time before repeating the pulse sequence;

reconstruct a series of multiple high resolution images; and acquire at least 12 contiguous slices within approximately three seconds to accomplish a thorough renal perfusion examination in under 5 minutes.

20. The MRI apparatus of claim 19 wherein the computer is also programmed to apply a steady state preparation sequence after the delay time and before a next application of the pulse sequence.

21. The MRI apparatus of claim 19 wherein the computer is also programmed to apply the pulse sequence with no dead time between slice acquisitions in each interleaved preparation pulse/acquisition slice sequence.

22. The MRI apparatus of claim 19 wherein the computer is also programmed to acquire images with enough spatial resolution to include both renal perfusion functional images and angiographic perfusion images in one MR image.

23. The MRI apparatus of claim 19 wherein the computer is further programmed to:

transmit a notched RF saturation pulse within a selected volume of slice locations, the notched RF saturation pulse having a stop-band between a pair of pass-bands; and acquire MR data in the stop-band of the notched RF saturation pulse.

24. A method of analyzing renal function with functional MR imaging comprising:

(A) injecting a contrast agent in a patient;
(B) defining an area of interest to include both kidneys of the patient;
(C) applying an interleaved acquisition pulse sequence to the area of interest;
(D) acquiring a series of high-resolution images of the area of interest in rapid succession, wherein the rapid succession of image acquisition includes acquiring at least twelve contiguous slices at a rate of approximately 250 msec. per slice such that each series of high-resolution images are acquired in approximately three seconds;
(E) allowing a delayed relaxation times;
(F) repeating steps (C)-(E) a prescribed number of time; and
(G) evaluating the series of images depicting temporal phases of contrast-enhanced blood uptake of both kidneys.

25. The method of claim 24 further comprising reconstructing images having angiographic information as well as renal perfusion data.

26. The method of claim 24 wherein image acquisition is not timed to any particular cycle of cardiac motion.

27. The method of claim 24 wherein the delayed relaxation time is user-prescribed.

28. The method of claim 27 wherein the delayed relaxation time is in the range of 10-20 seconds to allow free breathing by the patient during the delayed relaxation time.

29. The method of claim 24 further comprising applying a steady-state preparation sequence after the delayed relaxation time to ensure adequate saturation on a subsequent acquisition.

30. The method of claim 24 further comprising reconstructing a plurality of the series of high-resolution images depicting complete coverage of both kidneys for renal perfusion analysis.

31. The method of claim 24 applied to a patient regardless of whether breath-holding is demanded.

* * * * *